United States Patent
Achanta

(10) Patent No.: US 10,775,448 B2
(45) Date of Patent: Sep. 15, 2020

(54) AUTOMATIC PHASE IDENTIFICATION FOR ELECTRIC POWER DELIVERY LINES

(71) Applicant: Schweitzer Engineering Laboratories, Inc., Pullman, WA (US)

(72) Inventor: Shankar V. Achanta, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 242 days.

(21) Appl. No.: 16/011,320

(22) Filed: Jun. 18, 2018

(65) Prior Publication Data

US 2019/0383869 A1    Dec. 19, 2019

(51) Int. Cl.
  *G01R 31/60*    (2020.01)
  *G01R 15/18*    (2006.01)
  *H02J 13/00*    (2006.01)

(52) U.S. Cl.
  CPC ............. *G01R 31/60* (2020.01); *G01R 15/18* (2013.01); *H02J 13/00001* (2020.01)

(58) Field of Classification Search
  CPC ...... G01R 31/60; G01R 15/18; G01R 31/085; H02J 13/00001; H02H 3/10; H02H 3/46; Y04S 10/522
  USPC .... 324/66, 500, 508, 764.01, 771, 522, 713, 324/72.5, 76.11, 134, 111, 538–543, 600, 324/756.01
  See application file for complete search history.

(56) References Cited

U.S. PATENT DOCUMENTS

| | | | |
|---|---|---|---|
| 4,164,701 A | 8/1979 | Gulledge | |
| 4,314,199 A | 2/1982 | Yamaura | |
| 5,493,228 A | 2/1996 | Eriksson | |
| 6,483,435 B2 | 9/2002 | Saha | |
| 6,525,543 B1 | 2/2003 | Roberts | |
| 6,590,397 B2 | 7/2003 | Roberts | |
| 6,667,610 B2 | 12/2003 | Piesinger | |
| 7,345,488 B2 | 3/2008 | Fischer | |
| 7,948,225 B2 | 5/2011 | Coolidge | |
| 8,076,923 B2 | 12/2011 | Suozzo | |
| 8,217,640 B2 | 7/2012 | Tazzari | |
| 8,326,554 B2 | 12/2012 | Caird | |
| 8,570,023 B2 | 10/2013 | Uram | |
| 8,791,688 B2 | 7/2014 | Giubbini | |
| 8,797,018 B2 | 8/2014 | Watkins | |
| 9,230,429 B2 | 1/2016 | McKinley | |

(Continued)

OTHER PUBLICATIONS

PCT/US2011/022098 Patent Cooperation Treaty, International Search Report and Written Opinion of the International Searching Authority, dated Mar. 22, 2011.

(Continued)

*Primary Examiner* — Vincent Q Nguyen
*Assistant Examiner* — Trung Nguyen
(74) *Attorney, Agent, or Firm* — Stoel Rives LLP; Richard M. Edge

(57) ABSTRACT

Electric power system phase detection systems and methods. One or more line mounted intelligent electronic devices (IEDs) measure voltage at various points of a power system. The measured voltage is timestamped with a reference signal and compared with a timestamped voltage at a location where a phase on each conductor of the power system is known. Pattern matching using the measured voltage may be used to determine the phase at locations where the phase is unknown.

22 Claims, 6 Drawing Sheets

(56) References Cited

U.S. PATENT DOCUMENTS

| | | |
|---|---|---|
| 9,255,954 B2 | 2/2016 | Piesinger |
| 9,482,709 B2 | 11/2016 | Kussyk |
| 10,141,736 B2 * | 11/2018 | Li .................... G01R 31/085 |
| 10,615,604 B2 * | 4/2020 | Wells ................ G01R 19/2513 |
| 2005/0097373 A1 | 5/2005 | Stoupis |
| 2011/0181269 A1 | 7/2011 | Watkins |
| 2015/0022180 A1 | 1/2015 | Piesinger |
| 2015/0091545 A1 | 4/2015 | Kussyk |

OTHER PUBLICATIONS

EDM International, Inc., "PhaseTrakker—AP30—Quick and Accurate Phase Identification", Mar. 2016.

* cited by examiner

AUTOMATIC PHASE IDENTIFICATION FOR ELECTRIC POWER DELIVERY LINES

TECHNICAL FIELD

The present disclosure relates to phase identification on electric power delivery lines such as transmission and distribution lines.

BRIEF DESCRIPTION OF THE DRAWINGS

Non-limiting and non-exhaustive embodiments of the disclosure are described herein, including various embodiments of the disclosure with reference to the figures listed below.

Figure 1:
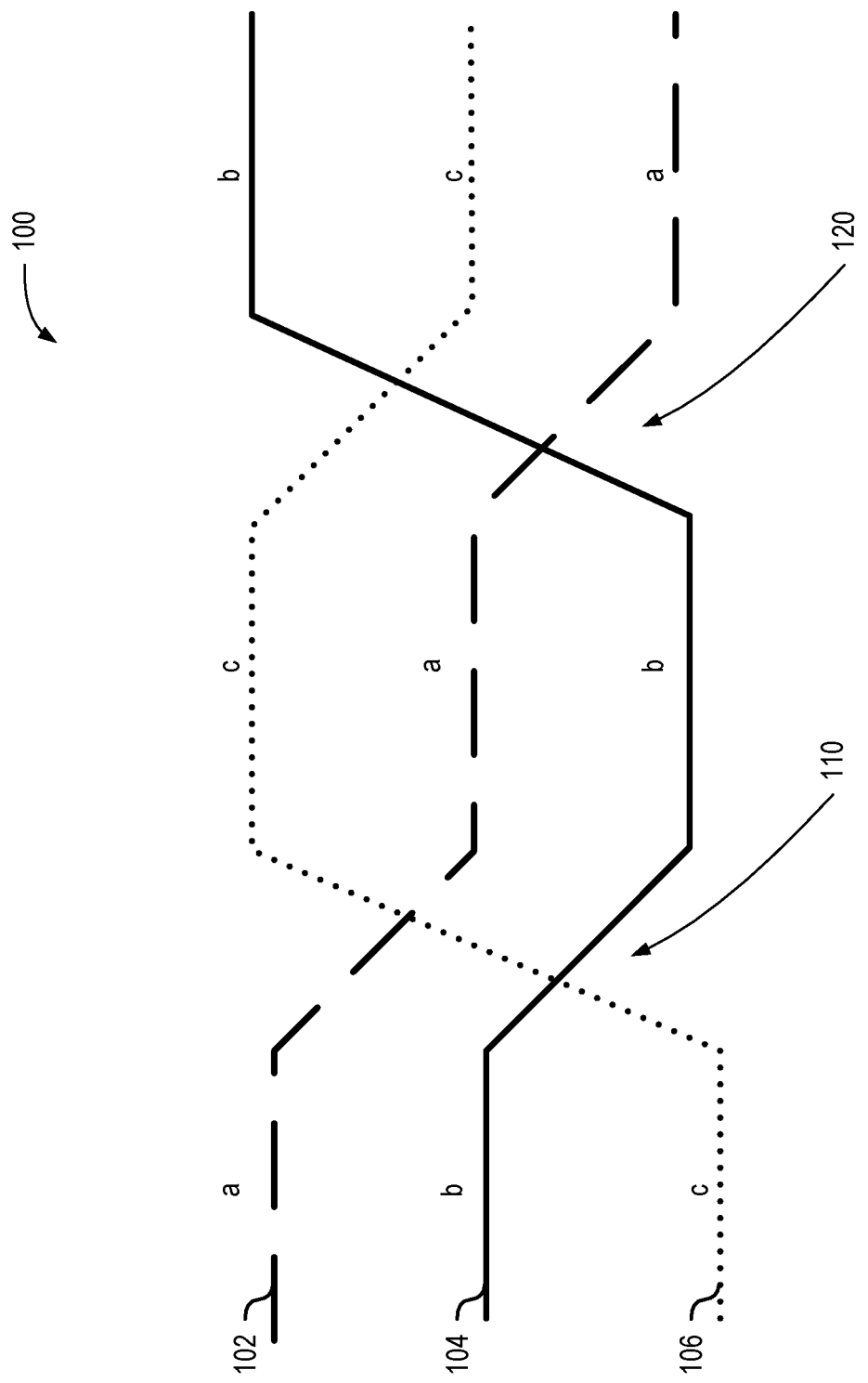
FIG. 1 illustrates a power line with two transpositions.

In the following description, numerous specific details are provided for a thorough understanding of the various embodiments disclosed herein. The systems and methods disclosed herein can be practiced without one or more of the specific details, or with other methods, components, materials, etc. In addition, in some cases, well-known structures, materials, or operations may not be shown or described in detail in order to avoid obscuring aspects of the disclosure. Furthermore, the described features, structures, or characteristics may be combined in any suitable manner in one or more alternative embodiments.

DETAILED DESCRIPTION

This disclosure provides systems, methods and apparatuses to identify a phase on a transmission or distribution line. Some embodiments use line mounted intelligent electronic devices (IEDs) to capture and send timestamped voltage data to a central IED. The central IED may compare the timestamped voltage data to voltage data from a location where the phases are known to determine the phase of a conductor at each line mounted IED.

Transmission and distribution lines (referred to herein collectively as power lines) may be periodically transposed. A transposition of a power line is a physical realignment of the conductors of the power line. For example, in a three phase system, a power line comprises three conductors with voltage at three different phases. A transposition of the three conductors results in each phase moving to another physical position. Transpositions of the conductors in power lines improve transmission on a power line.

However, the transpositions make identifying a phase on a conductor at various points along a power line difficult. Line crews may need to identify phases to diagnose a failure or repair a power line. The conductors may not be labeled or even be mislabeled. To identify the phase on the conductor the line crews can visually trace transpositions on the power line or bring external phase identification systems to identify the phase on each conductor. The visual tracing may be tedious and time consuming, and the additional equipment of an external phase identification system may be bulky and unwieldy. Further, the line crews must take the time to test the conductors using the additional equipment.

The present disclosure provides systems, methods, and apparatuses that may automatically identify a phase on a conductor using a plurality of line mounted IEDs. Each line mounted IED may provide periodic voltage data that can be used to identify a phase on a conductor. A reference signal may be used to timestamp the voltage data, and pattern recognition may be used to identify phases of conductors associated with each line mounted IED. A plurality of IEDs placed along a power line may facilitate mapping of the transpositions without visual tracking or external phase identification systems.

Additional details and examples are provided with reference to the figures below. Generally speaking, the systems and methods disclosed herein may be adapted to interface with or be included as part of a protection element or protection ecosystem, such as a power system protection relay. Such protection devices may be configured to communicate with, control, operate, energize, de-energize, and/or disengage one or more power system components and provide an indication of where a potential fault has occurred. Protection relays may be installed in electric power transmission and distribution facilities to detect overloads, short circuits, and other fault conditions.

Many embodiments of a protective relay include electronic devices employing Field Programmable Gate Arrays (FPGAs), microcontrollers, CPUs, A/D converters, electronic displays, communication ports, and other electronic devices and systems to digitize power system current and/or voltage measurements, and process data associated with the digitized currents and voltages according to various algorithms and/or digital filters. A protective relay may be configured to make protection decisions based on data associated with a digitized power system's currents and/or voltages, and may communicate decisions made by a protective relay to an appropriate system or personnel, and/or may otherwise cause a suitable response to the digitized power system's currents and/or voltages.

An IED, which may be used for monitoring, protecting, and/or controlling industrial and utility equipment, such as in electric power delivery systems, may include system components to implement a method for identifying fault locations using the two sequence network approaches described herein. Such IEDs may be configured to use a single-ended two sequence network approach or a double-ended two sequence network approach. In both of these embodiments, the IED is able to provide accurate fault location information even during a pole-open event.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term IED may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers, programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term IED may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special-purpose processing device, such as an ASIC, PAL, PLA, PLD, CPLD, FPGA, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer-executable code located within or on a computer-readable storage medium, such as a non-transitory computer-readable medium. A software module may, for instance, comprise one or more physical or logical blocks of computer instructions, which may be organized as a routine, program, object, component, data structure, etc., that perform one or more tasks or implement particular data types, algorithms, and/or methods.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

The embodiments of the disclosure can be understood by reference to the drawings, wherein like parts are designated by like numerals throughout. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments.

FIG. 1 illustrates a power line 100 with two transpositions 110, 120. As shown, the power line 100 may include three conductors 102, 104, 106. A first conductor 102 may conduct a first voltage with a first phase, a second conductor 104 may conduct a second voltage with a second phase delayed 120 degrees from the first phase, and a third conductor 106 may conduct a third voltage with a third phase delayed 240 degrees from the first phase.

The transpositions 110, 120 are a physical realignment of the three conductors 102, 104, 106. The transpositions 110, 120 result in each phase moving to a next physical position in a regular sequence. For example, as shown, at a first transposition 110, the first conductor 102 moves from a top position to a middle position. And then at a second transposition 120, the first conductor 102 moves from the middle position to a bottom position. If another transposition were shown, the first conductor 102 would move from the bottom position to the top position to continue the sequence. Similarly, the second conductor 104 and the third conductor 106 follow the same sequence.

The transpositions 110, 120 provide benefits to the power line 100. For instance, the transpositions 110, 120 reduce electro-static and electromagnetic imbalances among the phases which results in voltage imbalance. The transpositions 110, 120 may further reduce system losses. Another benefit of the transpositions 110, 120 may include minimizing the inductive coupling and induced currents on the adjacent conductors. This reduction may help in reducing the stress on the circuit breakers when interrupting fault and load currents. Additionally, each transposition 110, 120 may reduce coupling between adjacent communication lines.

Due to the transpositions 110, 120 of the conductors 102, 104, 106, the identification of phases along the power line 100 becomes challenging for line crews. Sometimes phases are mislabeled, which adds to the phase identification complexity. Above ground cables may be visually traced to correct mislabeled phases. However, visual tracing is not an option for underground cables. As explained in more detail with reference to the other figures, a plurality of line mounted IEDs may be installed at various points of the power line 100 to automatically determine the phase of a conductor.

Figure 2:
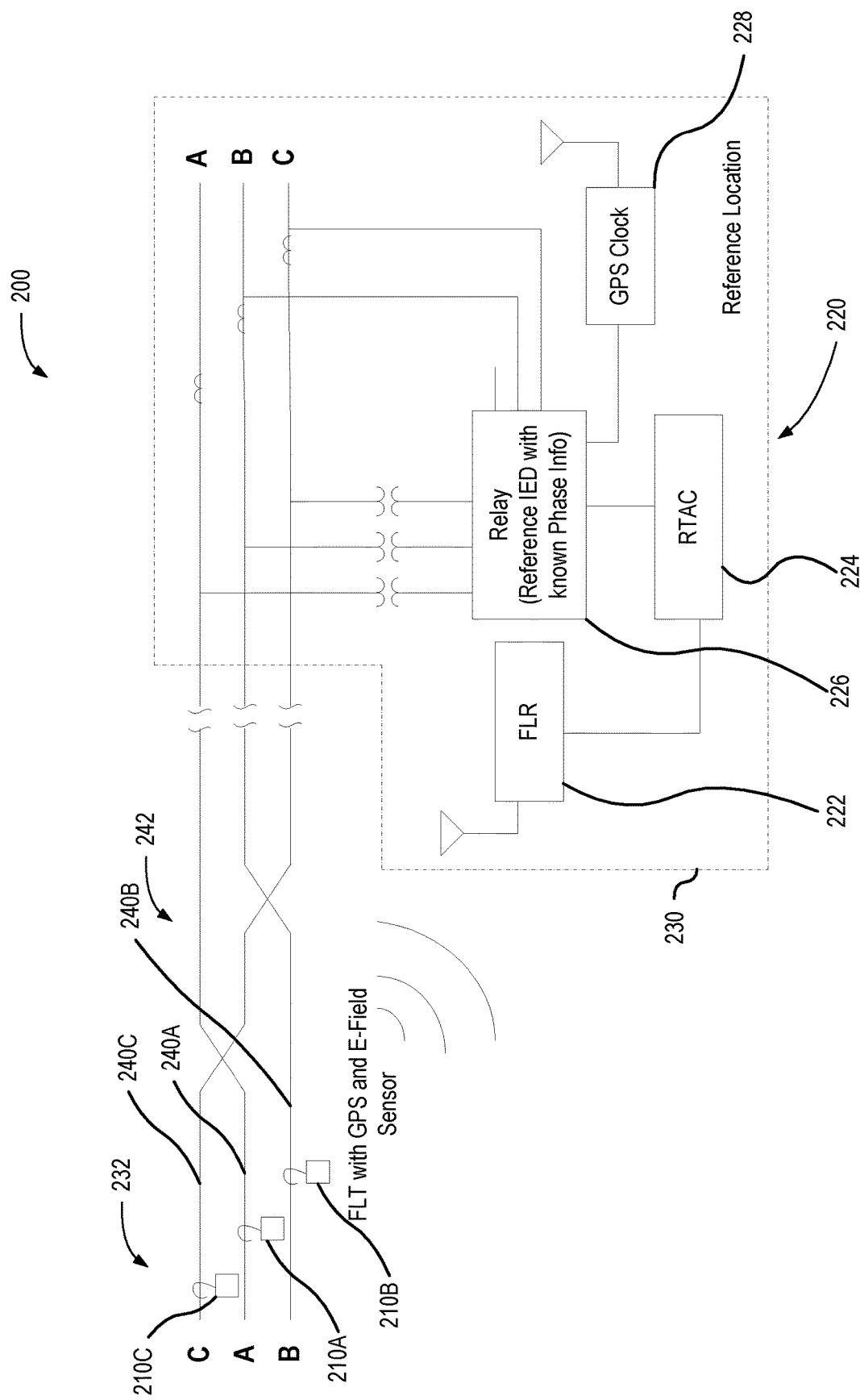
FIG. 2 illustrates a block diagram of an automatic phase identification system 200, according to one embodiment.

FIG. 2 is a block diagram of an automatic phase identification system 200, according to one embodiment. The automatic phase identification system 200 may determine a phase associated with a first conductor 240A, a second conductor 240B, and a third conductor 240C (referred herein collectively as conductors 250) of a power line 242 at a remote location 232 based on voltage data at a reference location 230.

A plurality of line mounted IEDs (e.g., a first line mounted IED 210A, second line mounted IED 210B, and third line mounted IED 210C referred herein collectively as line mounted IEDs 210) may collect timestamped voltage data at the remote location 232 and transmit the timestamped voltage data to a central IED 220. The timestamp may be synchronized to a reference signal. The central IED 220 may compare the received timestamped voltage data to voltage data at the reference location 230. The voltage data at the reference location 230 may also be timestamped using the same reference signal as the line mounted IEDs 210.

The line mounted IEDs 210 may be installed on overhead or underground cables. When the line mounted IEDs 210 are installed at various points along a length of the power line 242, the transpositions may be mapped. For instance, based on position data and voltage data, the phases and arrangement of the conductors 250 may be determined. This may allow a line crew to identify which conductor is associated with which phase. For example, the first conductor 240A may be identified as carrying a phase A by the first line mounted IED 210A. Further, the position data from each of the line mounted IEDs 210 may be compared. The positional comparison may indicate that relative to the second conductor 240B and the third conductor 240C, the first conductor 240A is in a second position at the remote location 232.

The line mounted IEDs 210 may include various sensors and transceivers. In some embodiments, the line mounted IEDs 210 may have a power sensor, a position module, and a transceiver. In some embodiments, the power sensor may include an E-field sensor. The power sensor in the line mounted IEDs 210 may produce an output that replicates the voltage on a conductor. The output of the power sensor may be a replica signal that is in phase with the voltage on the conductor.

The line mounted IEDs 210 may timestamp the power sensor output. The line mounted IEDs 210 may be synchronized to a reference signal. In some embodiments, that reference signal is a pulse per second signal, and may be received from the position module. For example, the position module may be a global positioning system (GPS) module, and the line mounted IEDs 210 may use the pulse per second signal from the GPS module as the reference signal. The transceiver of the line mounted IEDs 210 may communicate the timestamped power sensor output to the central IED 220. For example, each line mounted IED 210 may periodically send its ID and its zero-crossing timestamp to a central IED 220 at the reference location 230.

The line mounted IEDs 210 may have additional interfaces to convey information. For example, the line mounted IEDs 210 may include a human machine interface. The human machine interface may be a visual indicator. For instance, there may be a visual indication of the phase of the associated conductor. This visual indicator may be a set of lights that display colors based on the phase. The visual indicator may be a display such as an LCD display, an LED display, and an e-paper display. The line mounted IEDs 210 may also include an interface for local personal electronic devices (PED). For instance, an onsite line crew may use a smartphone/tablet to communicate with the line mounted IEDs 210, and the PED may display the phase information.

The line mounted IEDs 210 may be line powered devices. For example, the line mounted IEDs 210 may include a transformer to produce a proportional voltage or current from a magnetic field produced by a conductor. However, the proportional voltage current may be insufficient to power the line mounted IEDs 210 constantly. Therefore, in some embodiments, the line mounted IEDs 210 take periodic samples of the voltage, store the samples and then enter a sleep mode. In some embodiments, the line mounted IEDs 210 may activate the GPS receiver periodically, which will draw additional power. At another point in time the line mounted IEDs 210 exit sleep mode. For instance, the line mounted IEDs 210 may wake during a predetermined polling time slot and communicate voltage samples to the central IED 220.

The voltage sampling, time synchronization, and the communication may be coordinated to ensure sufficient power. During each process, the power consumption should not exceed the maximum power that can be derived from the transformer. During sleep mode, the transformer may harvest energy to provide additional power during processing times.

In some embodiments, the line mounted IEDs 210 may be integrated with current line mounted devices. For example, line mounted IEDs 210 may be integrated with faulted circuit indicators (FCIs). FCIs are installed on overhead and underground cables to detect fault conditions for both momentary and temporary faults. As these devices are measuring the voltage at various points on the power system, they can also be used to detect phase information for the phase that they are powered from. In some embodiments, the line mounted IEDs 210 may be an FCI or fault and load transmitter.

The central IED 220 may be located at the reference location 230. At the reference location 230, the phases for each conductor is known. In some embodiments, the central IED 220 may be a custom relay. In some embodiments, the central IED 220 may comprise a group of networked devices. As illustrated, the central IED 220 may comprise a fault and load receiver (FLR) 222, a real-time automation controller (RTAC) 224, a relay 226, and a clock 228.

The FLR 222 may be a radio concentrator that receives signals from and transmits signals to the line mounted IEDs 210 via wireless communication. The FLR 222 may comprise an antenna, a transceiver, and a processor. The FLR 222 aggregates fault information, load information, and timestamped voltage data from the line mounted IEDs 210. The FLR 222 may transmit this information to the RTAC 224 via DNP3 protocol using Ethernet. The FLR 222 may receive both solicited and unsolicited samples from the line mounted IEDs 210. For example, in some embodiments the line mounted IEDs 210 may send data periodically according to a schedule.

The clock 228 may be synchronized to the same reference signal as the line mounted IEDs 210. Thus, the central IED 220 and the line mounted IEDs 210 may be synchronized to each other. For example, the clock 228 may be a GPS clock and the GPS signal may provide absolute time reference. The clock 228 may be in communication with the relay 226 to provide a reference time.

The relay 226 may determine the voltage on the conductors 250. In some embodiments, the relay 226 may measure or detect a voltage proportional to the voltage on the conductor. The relay 226 may know phase information for each of the conductors 250. In some embodiments, the relay 226 timestamps voltage measurements using the reference time from the clock 228. The relay 226 may send the timestamped voltage measurements with phase information to the RTAC 224.

The RTAC 224 receives voltage data from the relay 226 and from the line mounted IEDs 210. The RTAC 224 may perform pattern matching to determine the phases of the conductors 250 at the remote location 232. For example, the RTAC 224 may compare zero crossing timestamps of voltage signal from the relay 226 with voltage data from the line mounted IEDs 210. Based on this determination, the central IED 220 may send a message indicating which phase is carried by which conductor. This message may be sent to the line mounted IEDs 210, a remote server, and/or a PED.

In some embodiments, the central IED 220 may track phase shifts on the line mounted IEDs 210. For instance, the central IED 220 may compare the results of pattern matching over a time period to determine if the phase has shifted. The shifting in phase may be caused by load changes. A limit may be set by a user defining how much phase shift is acceptable. If the limit is reached, the central IED 220 may send an alarm signal indicating that the phase has shifted to the limit.

Figure 3:
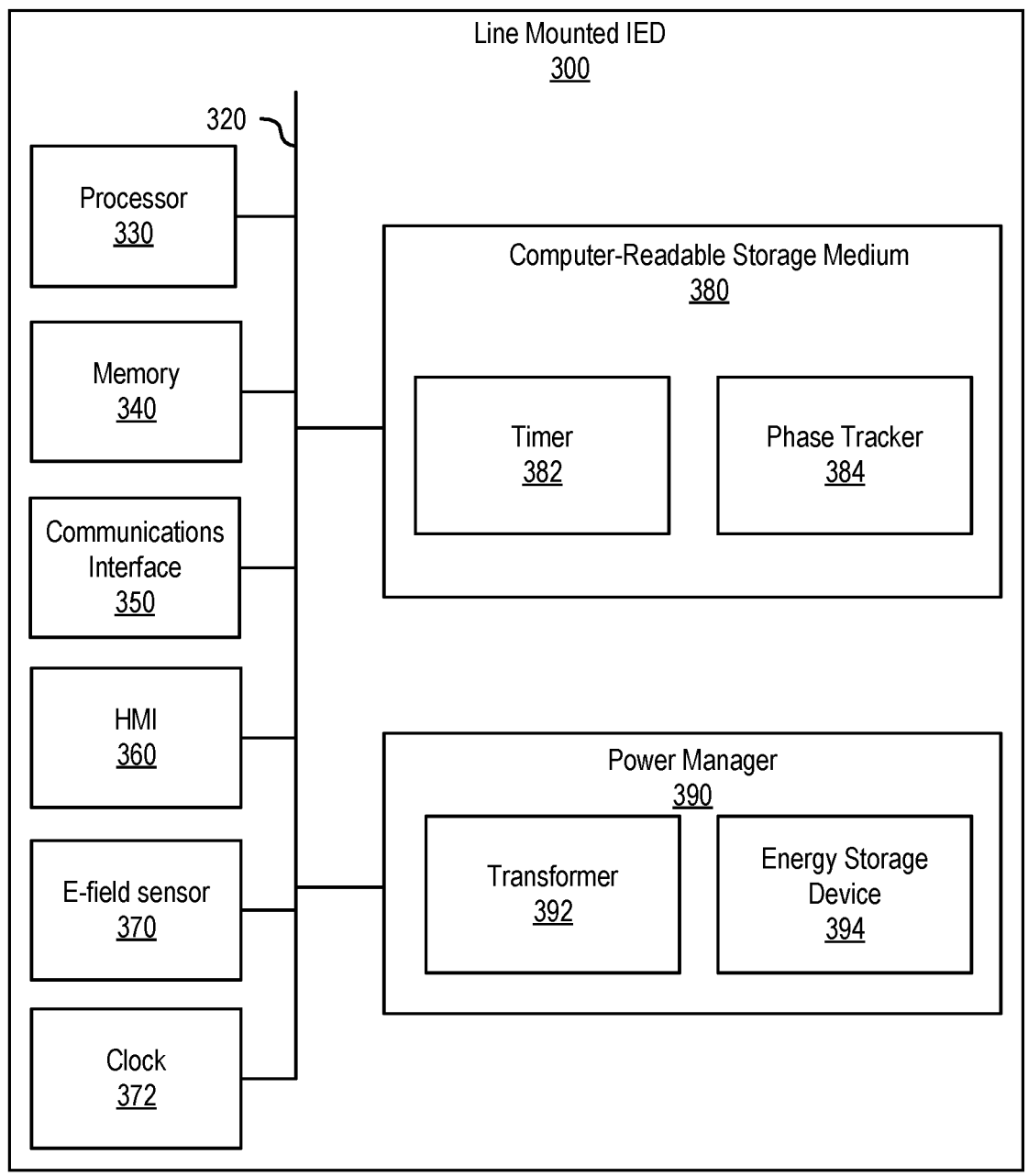
FIG. 3 illustrates a block diagram of a line mounted IED, according to one embodiment.

FIG. 3 illustrates a block diagram of a line mounted IED 300, according to one embodiment. The line mounted IED 300 monitors voltage on a power line to identify the phase. The line mounted IED 300 may be used in the automatic phase identification system 200 of FIG. 2. The line mounted IED 300 may comprise a processor 330, a memory 340, a communications interface 350, an HMI 360, a E-field sensor 370, a clock 372, a power manager 390, and a computer-readable storage medium 380. A bus 320 may connect the processor 330, memory 340, communications interface 350, HMI 360, E-field sensor 370, clock 372, power manager 390, and computer-readable storage medium 380.

The processor 330 may be a general-purpose processor to perform tasks such as computing and/or compiling. The processor 330 may execute instructions stored on the computer-readable storage medium 380 to perform phase identification operations.

The memory 340 and the computer-readable storage medium 380 may be any piece of hardware capable of storing information such as data, computer programs, and/or other suitable information. The memory 340 may include volatile memory and/or non-volatile memory, and may be fixed or removable. The memory 340 may include RAM, ROM, a hard drive, a flash memory, a thumb drive, an optical disk, a magnetic tape, or some combination of the above. In one embodiment, the memory 340 may be used to store instructions to be executed by the processor 330.

The communications interface 350 may be an interface to communicate with various external systems. For example, the communications interface 350 may facilitate communications between the line mounted IED 300 and another IED such as the central IED. Communication between the line mounted IED 300 and a remote device may be accomplished with wireless radio, satellite, or other transmission networks. In one embodiment, the line mounted IED 300 may network with other line mounted IEDs to form an IED network. The network may improve range of the line mounted IED 300 by allowing information to be distrusted through neighboring line mounted IEDs.

In some embodiments, the communications interface 350 may facilitate communications between the line mounted IED 300 and a local device. For example, the line mounted IED 300 may comprise a local transceiver to communicate with a PED. For example, the line mounted IED 300 may communicate with a PED via Bluetooth.

In some embodiments, a plurality of line mounted IEDs may be near the same location. For instance, a line mounted IED may be placed on three conductors of a power line at a same distance from a central IED. In some embodiments, the IEDs may determine the nearest IED to a PED, and only the nearest IED communicates with the PED. GPS positioning of the IEDs and the PED may be compared to determine proximity. In some embodiments, signal strength between the IEDs and the PED may be used to determine proximity. In some embodiments, a PED may display the phase of the nearest IED or may display a model illustrating the phases on each of the conductors based on the PED's orientation.

The HMI 360 may include a visual indicator to identify a phase matching the unidentified phase. The HMI 360 may comprise any mechanism necessary to relay information to the user. For example, the HMI 360 may comprise a display, screen, lights, speakers, or some other appropriate device for conveying information to users or technicians. For example, the HMI 360 may include one or more lights with three colors, wherein each color represents a different phase.

The E-field sensor 370 may determine a voltage on a conductor. Determining the voltage on the conductor may include measuring a proportional voltage from the transformer or detecting the voltage using a hall sensor. For example, the E-field sensor 370 may use magnetic fluctuations surrounding the conductor to measure the voltage on the conductor. The measurements may be an input to the modules of the computer-readable storage medium 380.

The clock 372 may be synchronized to a time reference signal. In some embodiments, the time reference signal is a pulse per second signal. For example, the clock 372 may be synchronized to a pulse per second signal received from a GPS.

The line mounted IED 300 may be powered from the conductor being measured. The power manager 390 may receive power and control power consumption. In some embodiments, the line mounted IED 300 may include a transformer 392 and an energy storage device 394. The transformer 392 may receive power from the measured conductor. The power may not be sufficient to perform all of the processes of the line mounted IED 300 concurrently. Thus, the power manager 390 may schedule processes to ensure that there is sufficient power. In some embodiments, the power manager 390 may store excess received energy in the energy storage device 394. The power manager 390 may consider the stored excess received energy when performing scheduling.

The computer-readable storage medium 380 may be a non-transitory memory device, according to one embodiment, and include any number of modules (e.g., 382, 384) for automatically identifying a phase on an associated conductor. In some embodiments, one or more of the modules may be implemented in hardware and/or firmware instead of software. In some embodiments, one or more of the modules may be implemented in a cloud-based or remote location and interface via a communications interface, such as the communications interface 350.

The computer-readable storage medium 380 may comprise a timer 382 and a phase tracker 384. The timer 382 may receive samples from the E-field sensor 370, and use the clock 372 to timestamp the samples. The line mounted IED 300 may send the timestamped voltage samples to a remote device via the communications interface 350 for phase recognition. The phase tracker 384 may receive the phase recognition result from the remote device via the communications interface 350. The phase tracker 384 may monitor for changes in the phase recognition results and send an alarm signal if the phase changes. The alarm signal may cause the HMI 360 to display an alert and the communications interface 350 to forward the alarm signal to a monitored location.

Figure 4:
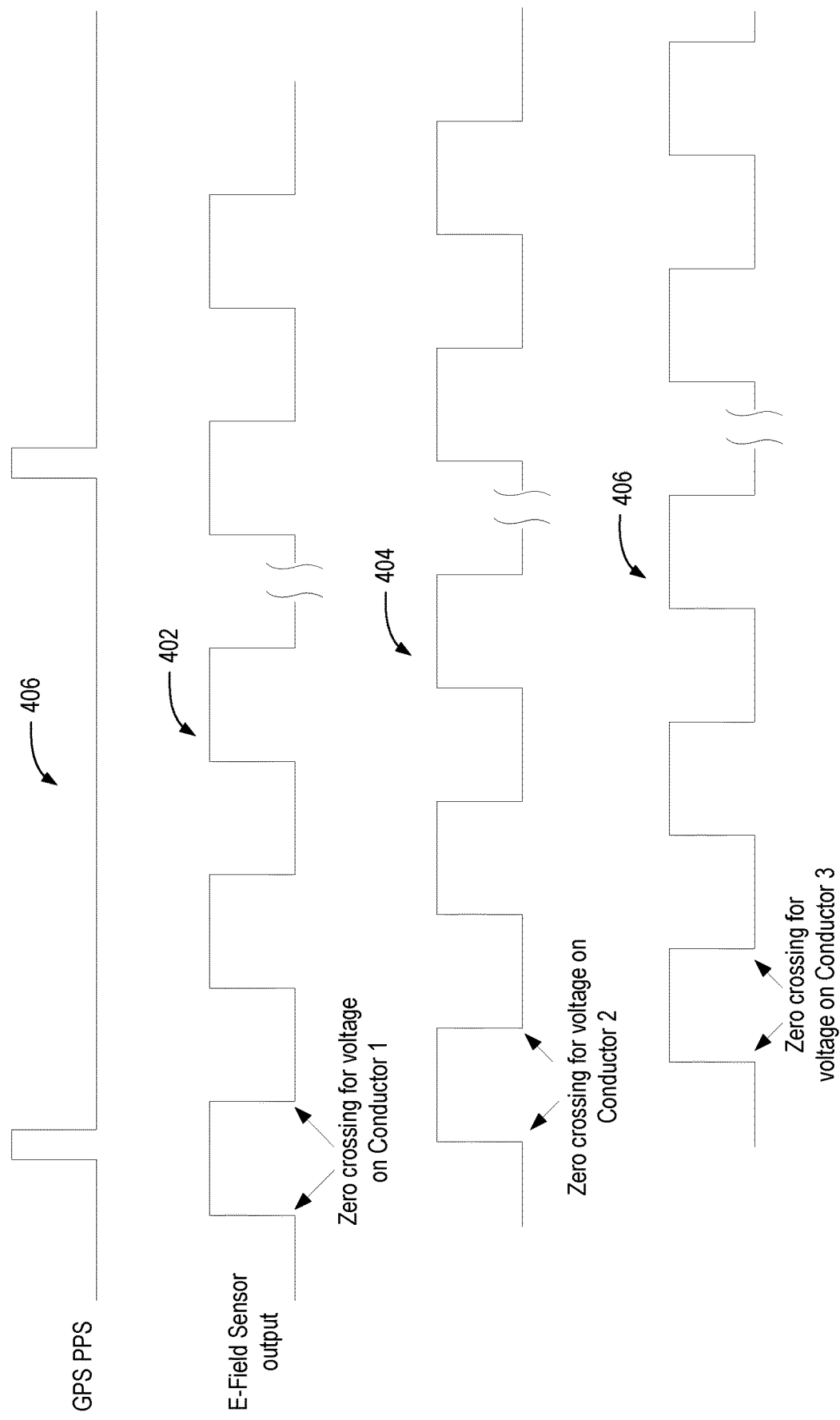
FIG. 4 illustrates the output of three electric field sensors mounted on three conductors with unknown phases.

FIG. 4 illustrates the output of three e-field sensors mounted on three conductors with unknown phases. In the illustrated embodiment, the output is a square wave with a pulse for the positive half cycle of the primary system voltage. A first output 402 is a square wave signal that is a replica of the voltage on a first conductor. A second output 404 is a square wave signal that is a replica of the voltage on a second conductor. A third output 406 is a square wave signal that is a replica of the voltage on a third conductor. The zero crossings for each output vary based on the phase.

A line mounted IED may timestamp the zero crossing of the output of the three e-field sensors using a time reference signal 406. In the illustrated embodiment, the time reference signal 406 is a GPS PPS. The reference signal may be received using a built-in GPS receiver. The line mounted IED may send the timestamped data for each output to a central IED. For example, each line mounted IED may periodically send its ID and its zero-crossing timestamp to a central IED at the reference location. In some embodiments, the timestamp information may not be sent in real time.

Figure 5:
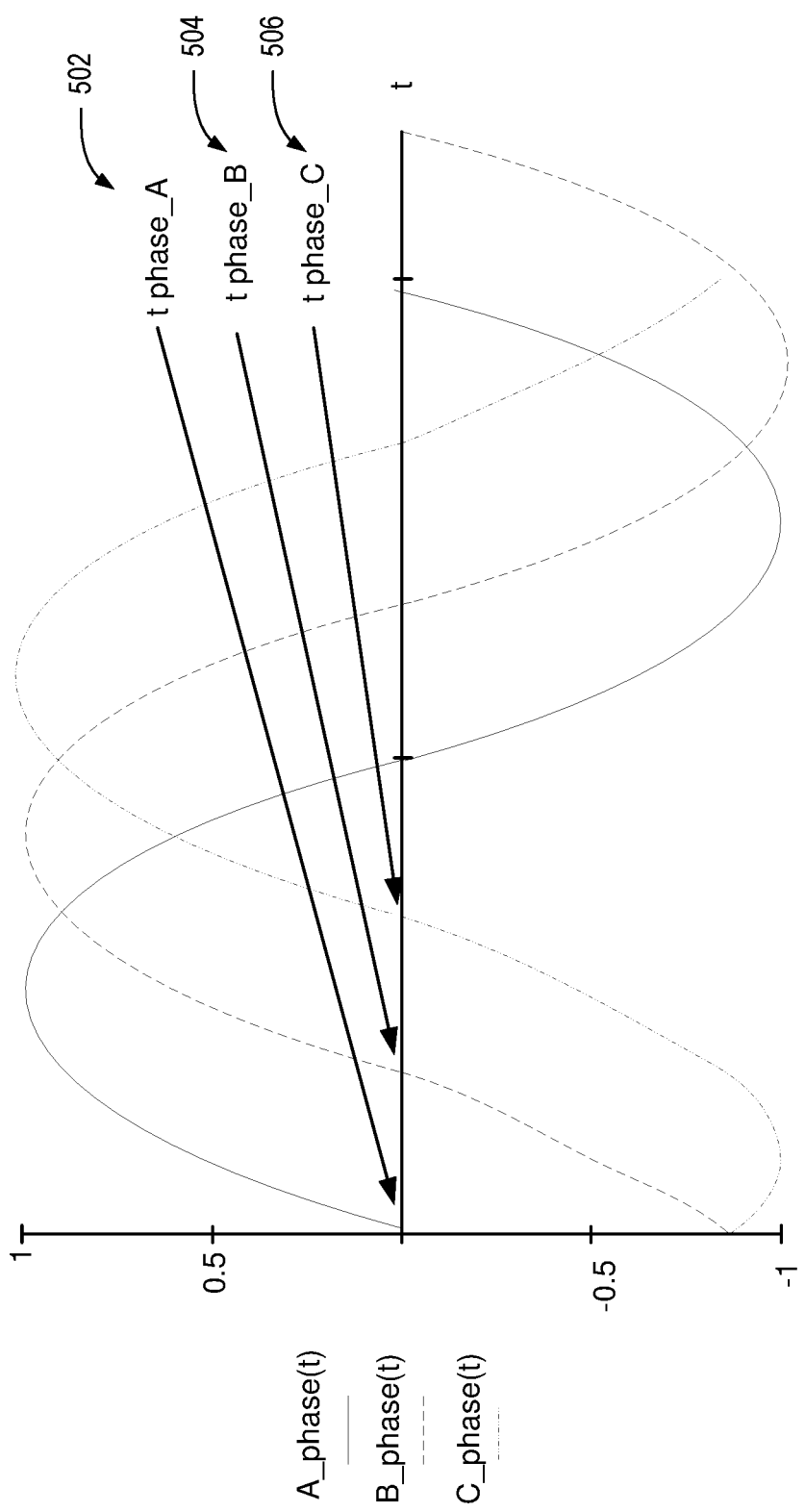
FIG. 5 illustrates the voltages on three conductors at a reference location.

FIG. 5 illustrates the voltages on each conductor of FIG. 4 at a reference location. The reference location is a place along the conductors where the phases on each conductor are known. A central IED may capture the voltages at the known location and timestamp the zero crossings of each phase using the same time reference signal as illustrated in FIG. 4. The zero-crossing timestamp information at the reference location (502, 504, 506) is compared with the zero-crossing timestamp information from line mounted IEDs.

In some embodiments, the central IED may use a relay to capture the voltages, and a GPS receiver for the timestamp reference signal. An RTAC may be used to compare the zero-crossing timestamp information. In some embodiments, pattern matching is used to determine the phase of each conductor associated with the line mounted devices. Once the central IED determines the phases for each line mounted device, the central IED may send a configuration file update to the line mounted IEDs. The configuration file update may be sent via an FLR and contain a phase identification.

Figure 6:
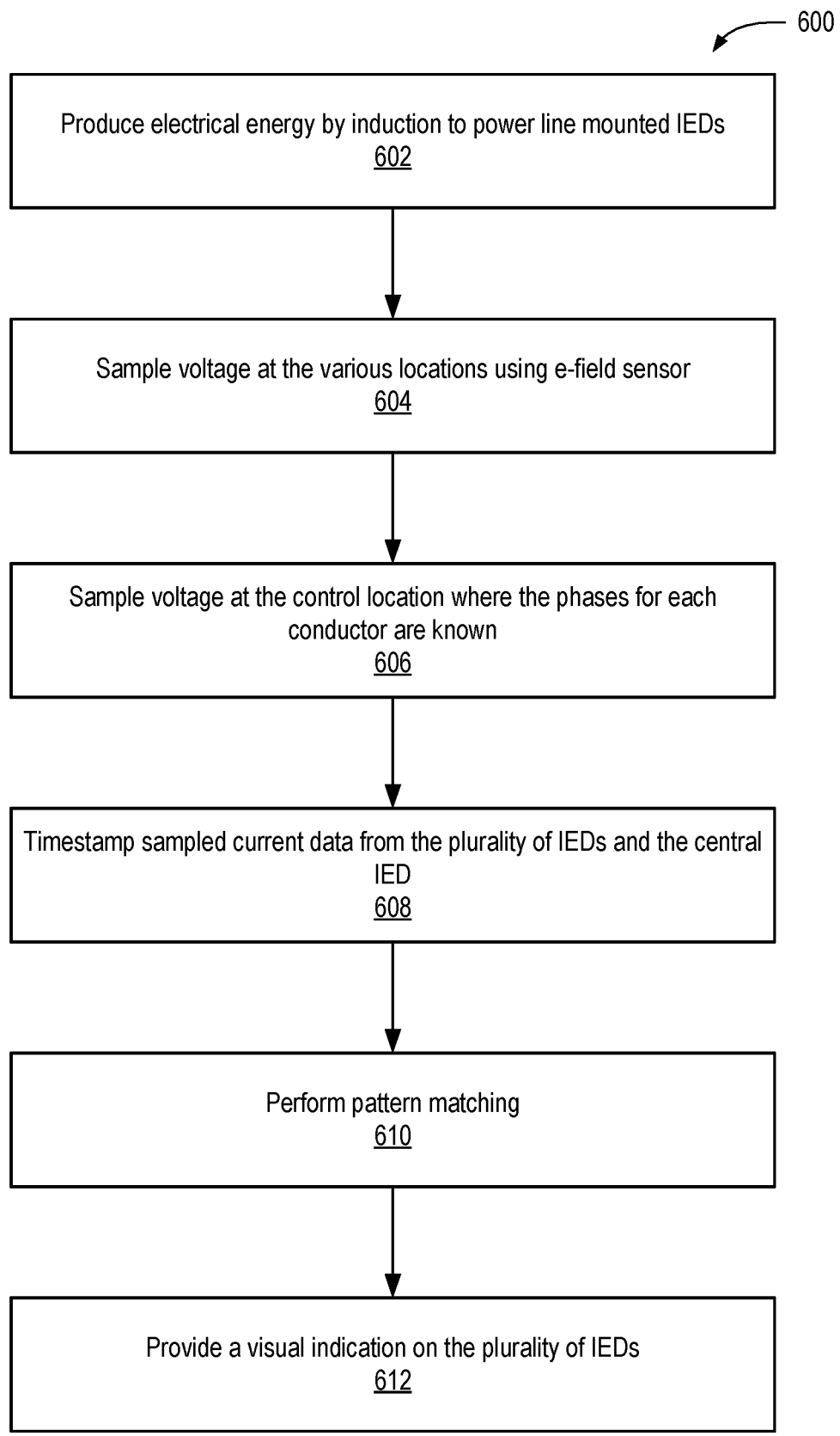
FIG. 6 is a flow diagram of a method of verifying the phase of power lines at various locations.

FIG. 6 is a flow diagram of a method 600 of verifying the phase of power lines at various locations. The method 600 may use a plurality of IEDs placed on conductors of the power lines at various lengths. The IEDs may produce 602 electrical energy by induction for power. For example, in some embodiments, the IEDs may comprise a transformer to produce electrical energy. The transformer may produce the electromotive force from a fluctuating magnetic field generated from a fluctuating flow of electrical voltage on each conductor.

The IEDs may sample 604 the voltage at the various locations. The voltage may be sampled using an e-field sensor. The phase at the various locations may be unknown. A central IED may be located at a control location where the phase on each conductor of the power system is known. The central IED may sample 606 voltage at the control location where the phases for each conductor are known.

The method 600 may include timestamping 608 sampled voltage data from the plurality of IEDs and the central IED using a time reference signal that is synchronized across the plurality of IEDs and the central IED. The time reference signal may be a pulse per second signal from a GPS receiver. Timestamping 608 sampled voltage data may output a series of times where the voltage on each conductor crosses zero. The method 600 may further include performing 610 pattern matching between voltage samples from the central IED and voltage samples from each of the plurality of IEDs to determine a phase at each of the various locations based on the pattern matching. For example, the pattern matching may compare zero crossings of voltages at the control location to the zero crossings of voltages at various locations where the phase is unknown.

The method 600 may include providing 612 a visual indication on the plurality of IEDs of the phase at each of the various locations. For example, the IEDs may have displays or lights that indicate the phase of an associated conductor. The indication may provide identification of a phase on a conductor to a line crew.

In some embodiments, the method may further comprise mapping transpositions in a power line. For example, each of the IEDs may provide location data and the determined phase. A map may be generated showing how conductors are transposed along the length of a power line. This map may be displayed on a line crew's PED. Only a portion of the map may be displayed based on the position and orientation of the PED. For example, the PED may display a mile of conductor around the PED.

In some embodiments, the method may further comprise detecting phase shift differences between two IEDs on the same phase. A phase shift between two IEDs on the same phase may indicate a potential error between the two IEDs. Thus, in some embodiments an alarm may be used to alert a line crew to the potential error. This alarm may be triggered if a user defined threshold is reached. Additionally, the location of the error may be determined based on a location of the two IEDs. Additionally, a phase on a single IED may be tracked, and if the phase changes an alarm may be sent.

This disclosure has been made with reference to various embodiments, including the best mode. However, those skilled in the art will recognize that changes and modifications may be made to the embodiments without departing from the scope of the present disclosure. While the principles of this disclosure have been shown in various embodiments, many modifications of structure, arrangements, proportions, elements, materials, and components may be adapted for a specific environment and/or operating requirements without departing from the principles and scope of this disclosure. These and other changes or modifications are intended to be included within the scope of the present disclosure.

This disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element. The scope of the present invention should, therefore, be determined by the following claims.

What is claimed:

1. A system for verifying the phase of a power line, the system comprising:
    a first intelligent electronic device (IED) configured to be mounted on an unidentified conductor with an unidentified phase at a first location, the first IED comprising:
        a current transformer to produce a proportional current to power the first IED;
        a line mounted sensor to determine a voltage signal at the first location;
        a first clock that is synchronized to a time reference signal;
        a first processor in communication with the line mounted sensor and the first clock, the first processor to timestamp the voltage signal with the time reference signal; and a first transceiver in communication with the first processor, the first transceiver to transmit samples of the voltage signal with timestamps; and a second IED comprising:
   a voltage sensor to determine voltage on a first conductor with a first phase, a second conductor with a second phase, and a third conductor with a third phase, wherein the voltage sensor is at a second location where the phases for each conductor are known;
   a second clock that is synchronized to a time reference signal;
   a second transceiver to receive samples of the voltage signal with the time reference signal from the first IED; and
   a second processor in communication with the voltage sensor, the second clock, and the second transceiver, the second processor to:
      timestamp the voltage on the conductors at the second location with the time reference signal, and
      perform pattern matching on the samples of the voltage signal at the first location and the voltage at the second location by comparing timestamps associated with features of the voltage signal with timestamps associated with corresponding features of the voltage to determine which phase matches the unidentified phase of the voltage signal.

2. The system of claim 1, wherein the time reference signal is a pulse per second signal.

3. The system of claim 2, wherein the pulse per second signal is received from a global positioning system.

4. The system of claim 1, wherein the first IED is a fault-and-load transmitter.

5. The system of claim 1, wherein the second IED comprises a fault-and-load receiver, an automation controller, and a relay.

6. The system of claim 1, wherein the second transceiver is to further send a message indicating which phase matches the unidentified phase to the first transceiver.

7. The system of claim 6, wherein the first IED further comprises a visual indicator to identify a phase matching the unidentified phase.

8. The system of claim 7, wherein the visual indicator comprises one or more lights with three colors, wherein each color represents a different phase.

9. The system of claim 7, wherein the visual indicator comprises a display.

10. The system of claim 1, wherein the first IED further comprises a local transceiver to communicate with a local personal electronic device.

11. The system of claim 10, wherein the system further comprises a third IED configured to be mounted at a third location, the third IED comprising a second local transceiver to communicate with the local personal electronic device, and
   wherein only a nearer IED of the first IED and the third IED communicates with the local personal electronic device.

12. The system of claim 1, wherein the second transceiver is to receive both solicited and unsolicited samples.

13. The system of claim 1, wherein the samples of the voltage signal with the time reference signal from the first IED are periodic.

14. The system of claim 13, wherein the first processor is further to schedule transmission of the samples of the voltage signal with timestamps to conserve power of the first IED.

15. The system of claim 14, wherein the second processor is further to determine a phase shift on the samples of the voltage signal by comparing samples of a first period and a second period.

16. The system of claim 15, wherein the second IED further comprises an alarm that is triggered by the phase shift reaching a pre-determined limit.

17. The system of claim 1, wherein the features of the voltage signal the corresponding features of the voltage at the second location are zero-crossings.

18. A method to verify the phase of power lines at various locations, the method comprising:
   producing electrical energy within a plurality of intelligent electronic devices (IEDs) by induction, the electrical energy to power the plurality of IEDs;
   sampling voltages at various locations of a power network using the plurality of IEDs mounted on conductors of the power network;
   sampling voltages with a central IED at a control location where the phases for each conductor of the power network are known;
   timestamping sampled voltage from the plurality of IEDs and the central IED using a time reference signal that is synchronized across the plurality of IEDs and the central IED;
   performing pattern matching between voltage samples from the central IED and voltage samples from each of the plurality of IEDs to determine a phase at each of the various locations based on the pattern matching; and
   providing a visual indication on the plurality of IEDs of the phase at each of the various locations.

19. The method of claim 18, further comprising mapping transpositions in a power line using location data from each of the plurality of IEDs and the determined phase at each of the various locations.

20. The method of claim 18, further comprising detecting phase shifts between two IEDs on the same phase.

21. The method of claim 20, further comprising:
   detecting a change in the phase shifts between two IEDs on the same phase;
   locating a section of the power network experiencing the change based on a location of the two IEDs, wherein the section of the power network is between the two IEDs; and
   sending an alarm signal comprising the change and the section of conductor.

22. The method of claim 18, wherein the source of induction for producing electrical energy is a conductor of the power network.

* * * * *